(12) United States Patent
Purser et al.

(10) Patent No.: US 7,525,103 B2
(45) Date of Patent: Apr. 28, 2009

(54) TECHNIQUE FOR IMPROVING UNIFORMITY OF A RIBBON BEAM

(75) Inventors: Kenneth H. Purser, Lexington, MA (US); Atul Gupta, Beverly, MA (US)

(73) Assignee: Varian Semiconductor Equipment Associates, Inc., Gloucester, MA (US)

(*) Notice: Subject to any disclaimer, the term of this patent is extended or adjusted under 35 U.S.C. 154(b) by 381 days.

(21) Appl. No.: 11/537,011

(22) Filed: Sep. 29, 2006

(65) Prior Publication Data

US 2007/0170369 A1 Jul. 26, 2007

Related U.S. Application Data

(60) Provisional application No. 60/760,837, filed on Jan. 20, 2006.

(51) Int. Cl.
*H01L 21/425* (2006.01)
(52) U.S. Cl. .................. 250/396 ML; 250/492.21; 250/492.23; 250/492.3
(58) Field of Classification Search .......... 250/296 ML, 250/396, 492.21, 492.23, 492.3
See application file for complete search history.

(56) References Cited

U.S. PATENT DOCUMENTS

| | | | |
|---|---|---|---|
| 5,132,544 A | 7/1992 | Glavish | |
| 5,350,926 A | 9/1994 | White et al. | |
| 5,475,228 A * | 12/1995 | Palathingal | .................. 250/397 |
| 5,672,879 A | 9/1997 | Glavish | |
| 5,834,786 A | 11/1998 | White et al. | |
| 6,770,888 B1 * | 8/2004 | Benveniste et al. | ..... 250/396 ML |
| 6,933,507 B2 * | 8/2005 | Purser et al. | .......... 250/396 ML |
| 2004/0097058 A1 | 5/2004 | Purser et al. | |
| 2005/0017202 A1 | 1/2005 | White | |

FOREIGN PATENT DOCUMENTS

| WO | WO9802900 A | 1/1998 |
|---|---|---|
| WO | WO02063654 A | 8/2002 |

* cited by examiner

*Primary Examiner*—Nikita Wells
*Assistant Examiner*—Johnnie L Smith, II
(74) *Attorney, Agent, or Firm*—Hunton & Williams LLP

(57) ABSTRACT

A technique for improving uniformity of a ribbon beam is disclosed. In one particular exemplary embodiment, an apparatus may comprise a first corrector-bar assembly and a second corrector-bar assembly, wherein the second corrector-bar assembly is located at a predetermined distance from the first corrector-bar assembly. Each of a first plurality of coils in the first corrector-bar assembly may be individually excited to deflect at least one beamlet in the ribbon beam, thereby causing the beamlets to arrive at the second corrector-bar assembly in a desired spatial spread. Each of a second plurality of coils in the second corrector-bar assembly may be individually excited to further deflect one or more beamlets in the ribbon beam, thereby causing the beamlets to exit the second corrector-bar assembly at desired angles.

20 Claims, 7 Drawing Sheets

TECHNIQUE FOR IMPROVING UNIFORMITY OF A RIBBON BEAM

CROSS-REFERENCE TO RELATED APPLICATIONS

This patent application claims priority to U.S. Provisional Patent Application No. 60/760,837, filed Jan. 20, 2006, which is hereby incorporated by reference herein in its entirety.

This patent application is related to U.S. patent application Ser. No. 10/619,702, filed Jul. 15, 2003, now U.S. Pat. No. 6,933,507, which is hereby incorporated by reference herein in its entirety.

FIELD OF THE DISCLOSURE

The present disclosure relates generally to ion implantation and, more particularly, to a technique for improving uniformity of a ribbon beam.

BACKGROUND OF THE DISCLOSURE

Ion implanters are widely used in semiconductor manufacturing to selectively alter conductivity of materials. In a typical ion implanter, ions generated from an ion source are directed through a series of beam-line components which include one or more analyzing magnets and a plurality of electrodes. The analyzing magnets select desired ion species, filter out contaminant species and ions having incorrect energies, also adjusting ion beam quality at a target wafer. Suitably shaped electrodes can be used to modify the energy and the shape of the ion beam.

In production, semiconductor wafers are typically scanned with an ion beam. As used hereinafter, "scanning" of an ion beam refers to the relative movement of an ion beam with respect to a wafer or substrate surface.

The ion beam is typically either a "spot beam" having an approximately circular or elliptical cross section or a "ribbon beam" having a rectangular cross section. For the purpose of the present disclosure, a "ribbon beam" may refer to either a static ribbon beam or a scanned ribbon beam. The latter type of ribbon beam may be created by scanning a spot beam back and forth at a high frequency.

In the case of a spot beam, scanning of a wafer may be achieved by sweeping the spot beam back and forth between two endpoints to form a beam path and by simultaneously moving the wafer across the beam path. Alternatively, the spot beam may be kept stationary, and the wafer may be moved in a two-dimensional (2-D) pattern with respect to the spot beam. In the case of a ribbon beam, scanning of a wafer may be achieved by keeping the ribbon beam stationary and by simultaneously moving the wafer across the ribbon beam. If the ribbon beam is wider than the wafer, the one-dimensional (1-D) movement of the wafer may cause the ribbon beam to cover the entire wafer surface. The much simpler 1-D scanning makes ribbon beam a desired choice for single-wafer ion implantation production.

However, just like spot beams, ribbon beams can suffer from intrinsic non-uniformity problems. A ribbon beam typically consists of a plurality of beamlets, wherein each beamlet may be considered, conceptually, as one spot beam. Though beamlets within a ribbon beam travel in the same general direction, any two beamlets may not be pointing in exactly the same direction. In addition, each beamlet may have its intrinsic angle spread. As a result, during ion implantation with a ribbon beam, different locations on a target wafer may experience different ion incident angles. Furthermore, the beamlets may not be evenly spaced within the ribbon beam. One portion of the ribbon beam where beamlets are densely distributed may deliver a higher ion dose than another portion of the ribbon beam where beamlets are sparsely distributed. Therefore, a ribbon beam may lack angle uniformity and/or dose uniformity.

Although there have been attempts to improve either angle uniformity or dose uniformity of a ribbon beam, an efficient solution is not yet available for providing ribbon beams that meet both dose and angle uniformity requirements for ion implantation production. For example, it is typically required that a ribbon beam should produce, in a wafer plane, a dose uniformity with less than 1% variations together with an angle uniformity with less than 0.5° variations. Such stringent uniformity requirements are difficult to meet since both types of uniformity may be elusive.

In view of the foregoing, it would be desirable to provide a technique for improving uniformity of a ribbon beam which overcomes the above-described inadequacies and shortcomings.

SUMMARY OF THE DISCLOSURE

A technique for improving uniformity of a ribbon beam is disclosed. In one particular exemplary embodiment, the technique may be realized as an apparatus for improving uniformity of a ribbon beam having a plurality of beamlets. The apparatus may comprise a first corrector-bar assembly having a first set of magnetic core members and a first plurality of coils distributed along the first set of magnetic core members. The apparatus may also comprise a second corrector-bar assembly having a second set of magnetic core members and a second plurality of coils distributed along the second set of magnetic core members, wherein the second corrector-bar assembly is located at a predetermined distance from the first corrector-bar assembly. Each of the first plurality of coils may be individually excited to deflect at least one beamlet in the ribbon beam, thereby causing the plurality of beamlets to arrive at the second corrector-bar assembly in a desired spatial spread. In addition, each of the second plurality of coils may be individually excited to further deflect one or more beamlets in the ribbon beam, thereby causing the plurality of beamlets to exit the second corrector-bar assembly at desired angles.

In accordance with other aspects of this particular exemplary embodiment, the desired spatial spread of the plurality of beamlets at the second corrector-bar assembly may be achieved to produce a uniform ion dose associated with the ribbon beam exiting the second corrector-bar assembly. Alternatively, the desired spatial spread of the plurality of beamlets at the second corrector-bar assembly may be achieved to produce a non-uniform ion dose associated with the ribbon beam exiting the second corrector-bar assembly.

In accordance with further aspects of this particular exemplary embodiment, the desired angles of the plurality of beamlets may be achieved for an angle uniformity associated with the ribbon beam exiting the second corrector-bar assembly. Alternatively, the desired angles of the plurality of beamlets may be achieved to produce a spatially varying angle distribution associated with the ribbon beam exiting the second corrector-bar assembly.

In accordance with additional aspects of this particular exemplary embodiment, the deflections introduced by each of the first corrector-bar assembly and the second corrector-bar assembly may be linear.

In accordance with a further aspect of this particular exemplary embodiment, the apparatus may further comprise a controller that controls the individual excitations of the first plurality of coils and the second plurality of coils. The apparatus may also comprise one or more measurement devices that measure the ribbon beam.

In accordance with a yet further aspect of this particular exemplary embodiment, the controller may calibrate the first corrector-bar assembly and the second corrector-bar assembly by separately perturbing one or more of the first plurality of coils and the second plurality of coils and by aggregating corresponding changes in the ribbon beam.

In accordance with a still further aspect of this particular exemplary embodiment, the controller may cause at least one coil to be excited at a sufficiently high frequency to produce a dithering motion in at least one of the plurality of beamlets.

In another particular exemplary embodiment, the technique may be realized as a method for improving uniformity of a ribbon beam. The method may comprise providing a first corrector-bar assembly having a first set of magnetic core members and a first plurality of coils distributed along the first set of magnetic core members. The method may also comprise providing a second corrector-bar assembly having a second set of magnetic core members and a second plurality of coils distributed along the second set of magnetic core members, wherein the second corrector-bar assembly is located at a predetermined distance from the first corrector-bar assembly. The method may further comprise passing the ribbon beam through the first corrector-bar assembly. The method may additionally comprise exciting one or more of the first plurality of coils individually to deflect at least one beamlet in the ribbon beam, thereby causing the plurality of beamlets to arrive at the second corrector-bar assembly in a desired spatial spread. The method may also comprise exciting one or more of the second plurality of coils individually to further deflect one or more beamlets in the ribbon beam, thereby causing the plurality of beamlets to exit the second corrector-bar assembly at desired angles.

In accordance with other aspects of this particular exemplary embodiment, the method may further comprise exciting at least one coil with a sufficiently high frequency to produce a dithering motion in at least one beamlet.

In accordance with further aspects of this particular exemplary embodiment, a current frequency in at least one of the first plurality of coils and the second plurality of coils may be adjusted to control a local beamlet angle distribution.

In accordance with additional aspects of this particular exemplary embodiment, the method may further comprise the steps of: introducing a plurality of perturbations in one or more coils; measuring changes in the ribbon beam in response to the plurality of perturbations, each change corresponding to one perturbation; establishing a computation model by aggregating the measured changes; and selecting settings for the first plurality of coils and the second plurality of coils by evaluating one or more merit functions calculated based on the computation model.

In yet another particular exemplary embodiment, the technique may be realized as at least one signal embodied in at least one carrier wave for transmitting a computer program of instructions configured to be readable by at least one processor for instructing the at least one processor to execute a computer process for performing the method as recited above.

In still another particular exemplary embodiment, the technique may be realized as at least one processor readable carrier for storing a computer program of instructions configured to be readable by at least one processor for instructing the at least one processor to execute a computer process for performing the method as recited above.

In a further particular exemplary embodiment, the technique may be realized as a method for improving uniformity of a ribbon beam. The method may comprise providing one or more tuning elements near a path of a ribbon beam. The method may also comprise introducing a plurality of perturbations in the one or more tuning elements. The method may further comprise measuring changes in the ribbon beam in response to the plurality of perturbations, each change corresponding to one perturbation. The method may additionally comprise establishing a computation model by aggregating the measured changes. The method may also comprise selecting settings for the one or more tuning elements by evaluating one or more merit functions calculated based on the computation model.

In accordance with other aspects of this particular exemplary embodiment, the settings for the one or more tuning elements may be selected to produce a desired ion dose or angle distribution.

In accordance with further aspects of this particular exemplary embodiment, the desired ion dose or angle distribution may be selected from a group consisting of: a uniform distribution pattern, a non-uniform distribution pattern, and a configurable distribution pattern.

In accordance with additional aspects of this particular exemplary embodiment, the one or more tuning elements may be selected from a group consisting of: corrector-bar assemblies, multipoles, dipoles, coils, and magnetic rods.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION OF EXEMPLARY EMBODIMENTS

The related U.S. patent application Ser. No. 10/619,702, entitled "Controlling the Characteristics of Implanter Ion-Beams," discloses a corrector-bar technique for providing active correction across a ribbon beam. The active correction is achieved by passing the ribbon beam through a corrector-bar assembly.

Figure 1:
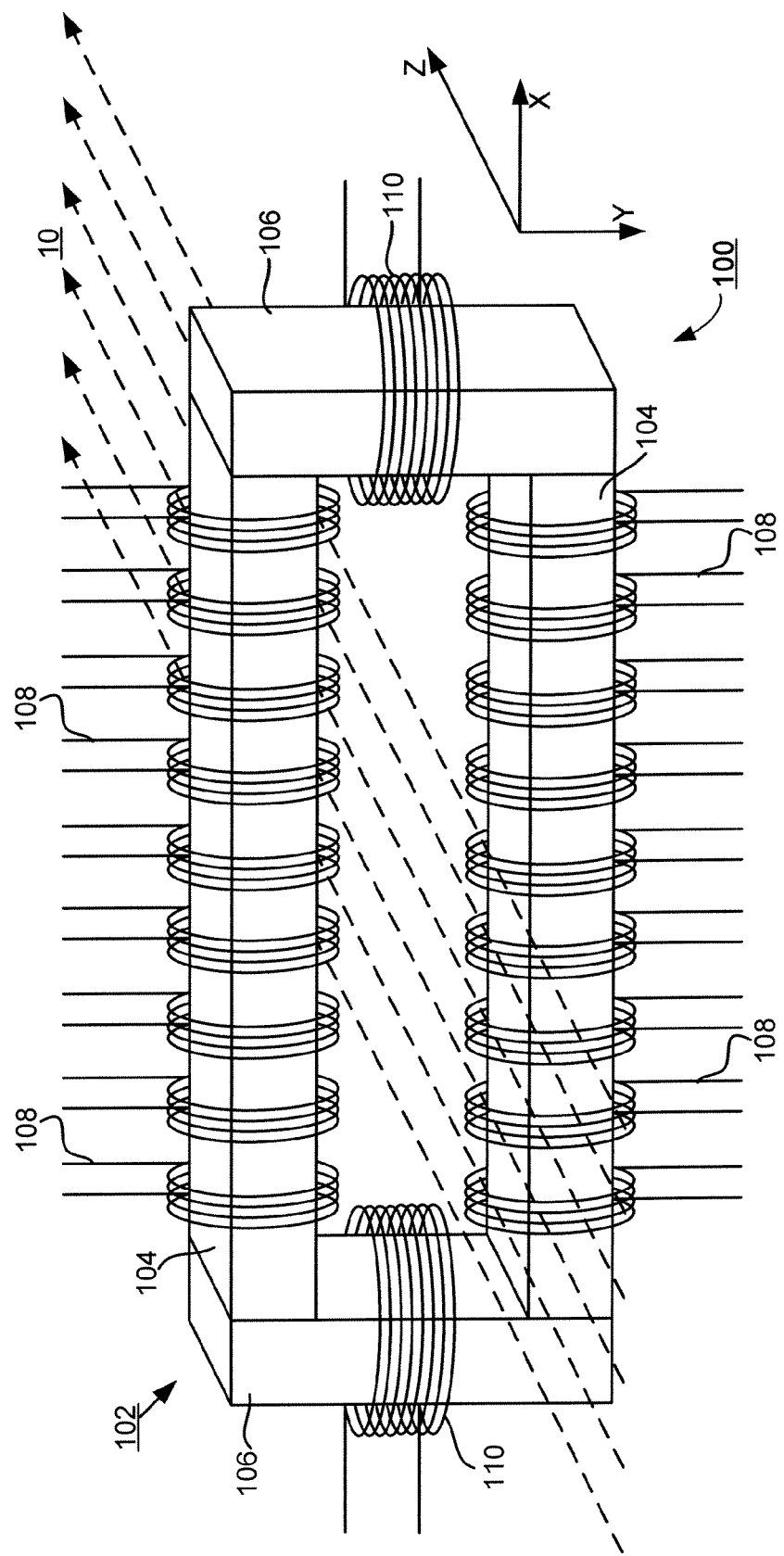
FIG. 1 shows an exemplary corrector-bar assembly in accordance with an embodiment of a prior disclosure.

One exemplary corrector-bar assembly 100 is shown in FIG. 1. The corrector-bar assembly 100 comprises a rectangular steel window frame 102 with an aperture to allow a ribbon beam 10 to pass through. The window frame 102 may comprise horizontal magnetic core members 104 and vertical magnetic core members 106. The window frame 102 provides a magnetic supporting structure needed for producing desired deflection fields. A plurality of coils 108 may be wound along the horizontal magnetic core members 104. Each coil 108 may be individually and/or independently excited with a current, so as to generate high-order multipole components without dedicated windings. Individual excitation of each coil 108, or each multipole, may deflect one or more beamlets within the ribbon beam 10. That is, local variations in ion density or shape of the ribbon beam 10 may be corrected by modifying the magnetic fields locally. These corrections may be made under computer control and on a time scale that is only limited by a decay rate of eddy currents in the horizontal magnetic core members 104.

Additional coils 110 may be wound around the vertical magnetic core members 106 to eliminate magnetic short circuits when multipole components are being generated. The coils 110 may also be excited independently to produce a pure dipole field in the Y direction between the horizontal magnetic core members 104. When the coils 110 are switched off, dipole fields may be generated in the X direction along the horizontal magnetic core members 104. These X- or Y-direction dipole fields may also be used to manipulate the ribbon beam 10 or beamlet(s) therein.

Figure 2:
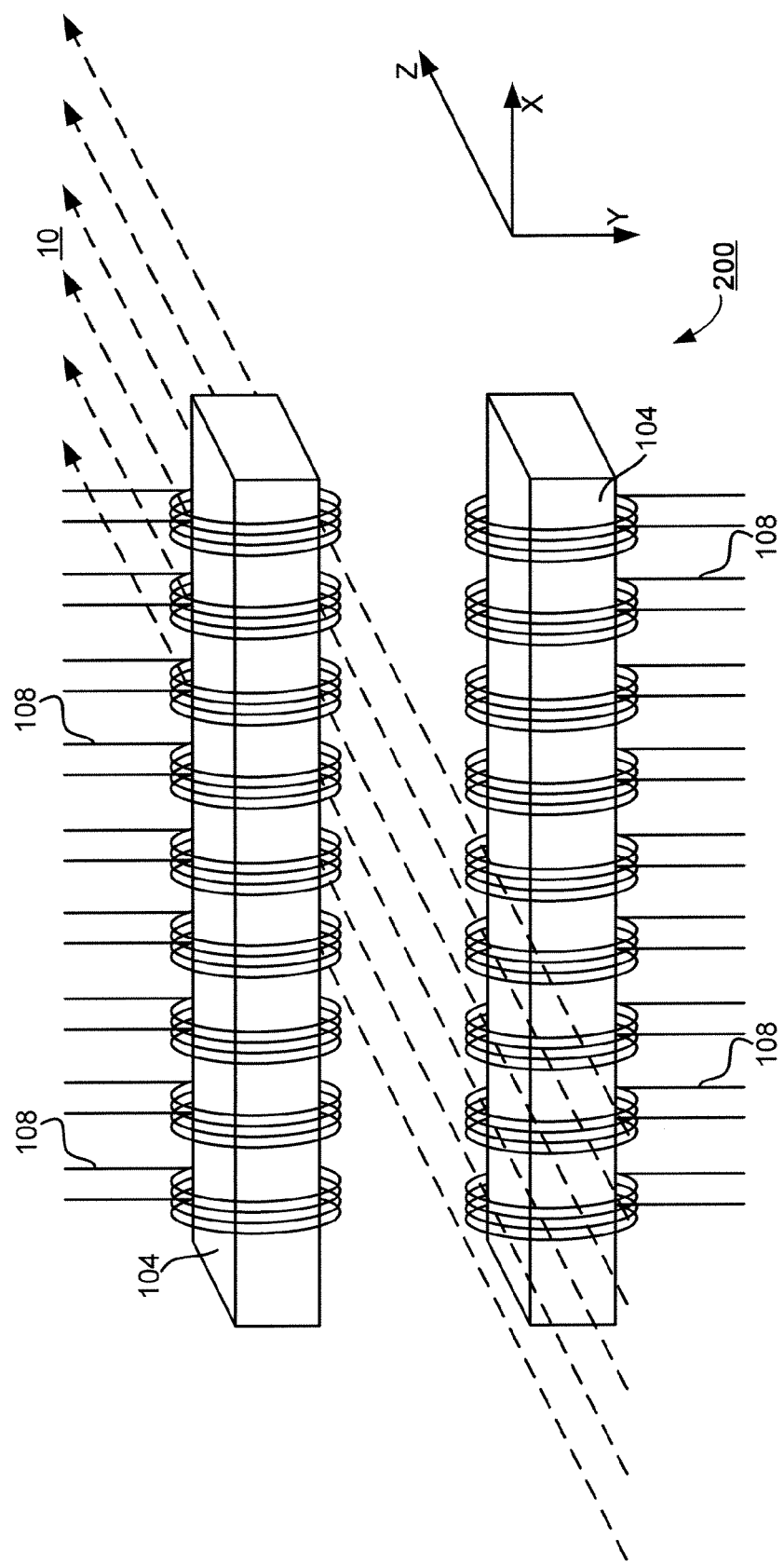
FIG. 2 shows another exemplary corrector-bar assembly in accordance with an embodiment of a prior disclosure.

FIG. 2 shows another exemplary corrector-bar assembly 200. Compared to the corrector-bar assembly 100 shown in FIG. 1, the corrector-bar assembly 200 does not have the vertical magnetic core members 106 or the coils 110. Apart from this difference, the corrector-bar assembly 200 may operate under substantially the same principles as the corrector-bar assembly 100.

Embodiments of the present disclosure build upon the above-described corrector-bar technique to improve both dose uniformity and angle uniformity in a ribbon beam. With capability of fine-tuning individual beamlets, at least two corrector-bar assemblies may be employed to provide independent and/or coordinated control over beamlet concentration and beamlet angles in a ribbon beam.

Figure 3:
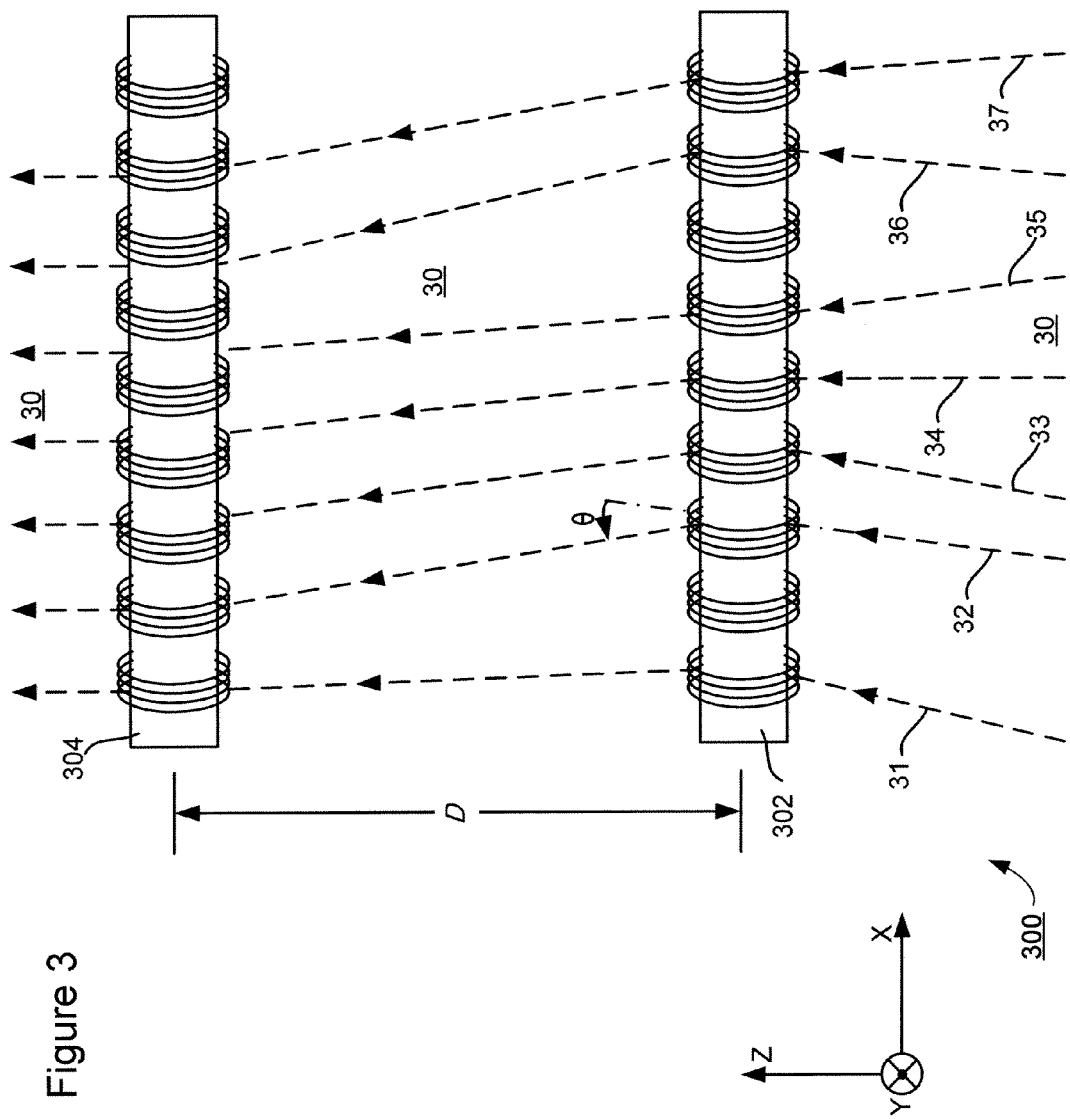
FIG. 3 shows a diagram illustrating an exemplary apparatus for improving uniformity of a ribbon beam in accordance with an embodiment of the present disclosure.

Referring to FIG. 3, there is shown a diagram illustrating an exemplary apparatus 300 for improving uniformity of a ribbon beam in accordance with an embodiment of the present disclosure. The apparatus 300 may comprise a first corrector-bar assembly 302 and a second corrector-bar assembly 304 which are positioned substantially in parallel with each other and separated by a distance D. Each corrector-bar assembly (302 or 304) may have a structure that is the same as or similar to the exemplary corrector-bar assemblies 100 and 200 shown in FIGS. 1 and 2 respectively. Alternatively, each corrector-bar assembly (302 or 304) may be the same as or similar to the exemplary corrector-bar assemblies (or variants thereof) as described in the related U.S. patent application Ser. No. 10/619,702.

For clarity, a top view of the apparatus 300 is shown in FIG. 3, wherein a ribbon beam 30 sequentially passes through the first corrector-bar assembly 302 and the second corrector-bar assembly 304. The ribbon beam 30 may comprise a plurality of beamlets (e.g., 31-37). As they enter the first corrector-bar assembly 302, the beamlets may lack uniformity in terms of both incident angles and ion doses. For example, the beamlet 34 has a small incident angle with respect to the Z direction, while the beamlets 31 and 33 have much larger incident angles. Also, the beamlets 31 and 32 are spaced further apart than the beamlets 32 and 33.

According to embodiments of the present disclosure, a "two-stage" correction may improve dose uniformity and angle uniformity of the ribbon beam 30. The first corrector-bar assembly 302 may be primarily responsible for the dose uniformity improvement. That is, coils in the first corrector-bar assembly 302 may be individually excited to produce local variations in a magnetic field so as to deflect individual beamlets. The deflection of individual beamlets, coupled with the distance D that the beamlets have to traverse before reaching the second corrector-bar assembly 304, may cause the beamlets to be spatially rearranged in the X direction. For example, the beamlet 32, which is spaced far apart from the beamlet 31, may be deflected by the first corrector-bar assembly 302 to the -X direction by a small angle θ. After the beamlet 32 has traveled the distance D in the Z direction to reach the second corrector-bar assembly 304, it will also have traveled laterally in the -X direction to become closer to the beamlet 31. Note that the beamlet 31 itself may or may not have been deflected in the meantime. Therefore, with proper settings for the coils in the first corrector-bar assembly 302, the beamlets in the ribbon beam 30 may be spatially redistributed by the time they reach the second corrector-bar assembly 304. The first corrector-bar assembly 302 may be referred to as a "dose uniformity corrector."

The second corrector-bar assembly 304 may be primarily responsible for the angle uniformity improvement. Each coil in the second corrector-bar assembly 304 may be individually excited to introduce desired deflections for individual beamlets in the ribbon beam 30. As a result, the beamlets may exit the second corrector-bar assembly 304 at desired angles (e.g., substantially the same angle). As shown here in FIG. 3, the ribbon beam 30 exiting the second corrector-bar assembly 304 may be substantially uniform in terms of both incident angle and ion dose. The second corrector-bar assembly 304 may be referred to as an "angle uniformity corrector."

According to some embodiments, it may be desirable that corrections made by one corrector-bar assembly operate orthogonally with respect to corrections introduced by the other corrector-bar assembly such that changes at the two corrector-bar assemblies do not affect one another. Accordingly, it may be beneficial to backtrack beamlet trajectories from a wafer plane back to the beamlet coordinates at the second corrector-bar assembly 304, for example. There are methods for tracing ions or ion beams that are well known to those skilled in the art.

The above-described "two-stage" correction methodology opens up numerous options to manipulate a ribbon beam. For example, independent control over dose uniformity and angle uniformity of the ribbon beam 30 may be possible by varying one or more parameters (e.g., distance D and coil settings in either or both corrector-bar assemblies) in the apparatus 300. The "two-stage" setup may be extended to a "multi-step" setup wherein three or more corrector-bar assemblies may be employed to sequentially manipulate the ribbon beam 30. Some exemplary implementation options are described below in connection with FIGS. 4-7.

Figure 4:
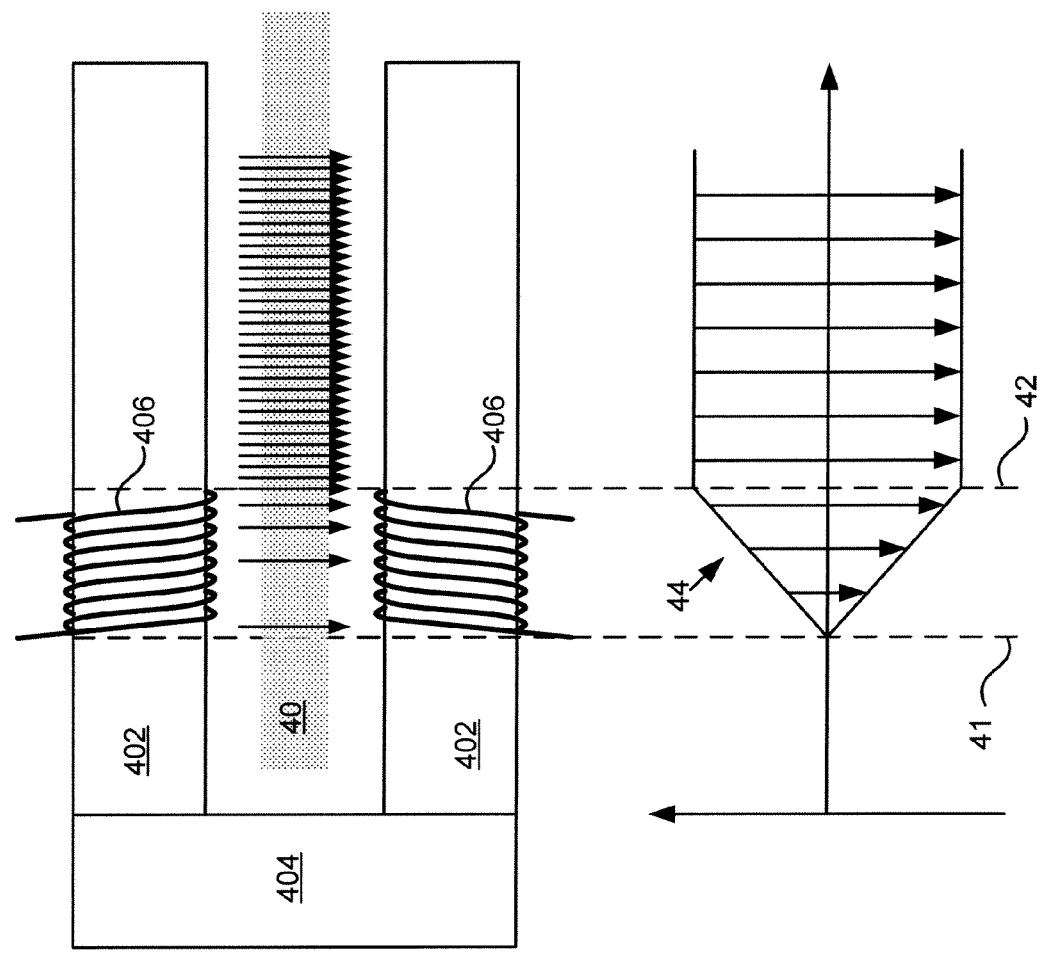
FIG. 4 illustrates an exemplary method for configuring a magnetic field in accordance with an embodiment of the present disclosure.

FIG. 4 illustrates an exemplary method for configuring a magnetic field in accordance with an embodiment of the present disclosure. A pair of magnetic core members (e.g., steel bars) 402 may be provided. A pair of coils 406 may be symmetrically wound around the magnetic core members 402, one coil 406 for each magnetic core member 402. The coils 406 may have opposite windings, one right-handed and the other left-handed. An end bar 404 may be optionally provided to connect the magnetic core members 402. By exciting the coils 406 with currents of the same magnitude, a magnetostatic potential profile 44 may be introduced. As shown, in a region between vertical lines 41 and 42, the magnetic field between the magnetic core members 402 may increase linearly. To the right of the region, a uniform magnetic field may be created. To the left of the region, there may be no magnetic field. As a ribbon beam 40 passes between the magnetic core members 402, Lorentz forces may cause ions or beamlets to the right of the vertical line 42 to be uniformly deflected. Ions or beamlets in the region between the vertical lines 41 and 42 may diverge due to the magnetostatic potential gradient. To the left of the vertical line 42, there may be no deflection of the ions or beamlets in the ribbon beam 40.

Figure 5:
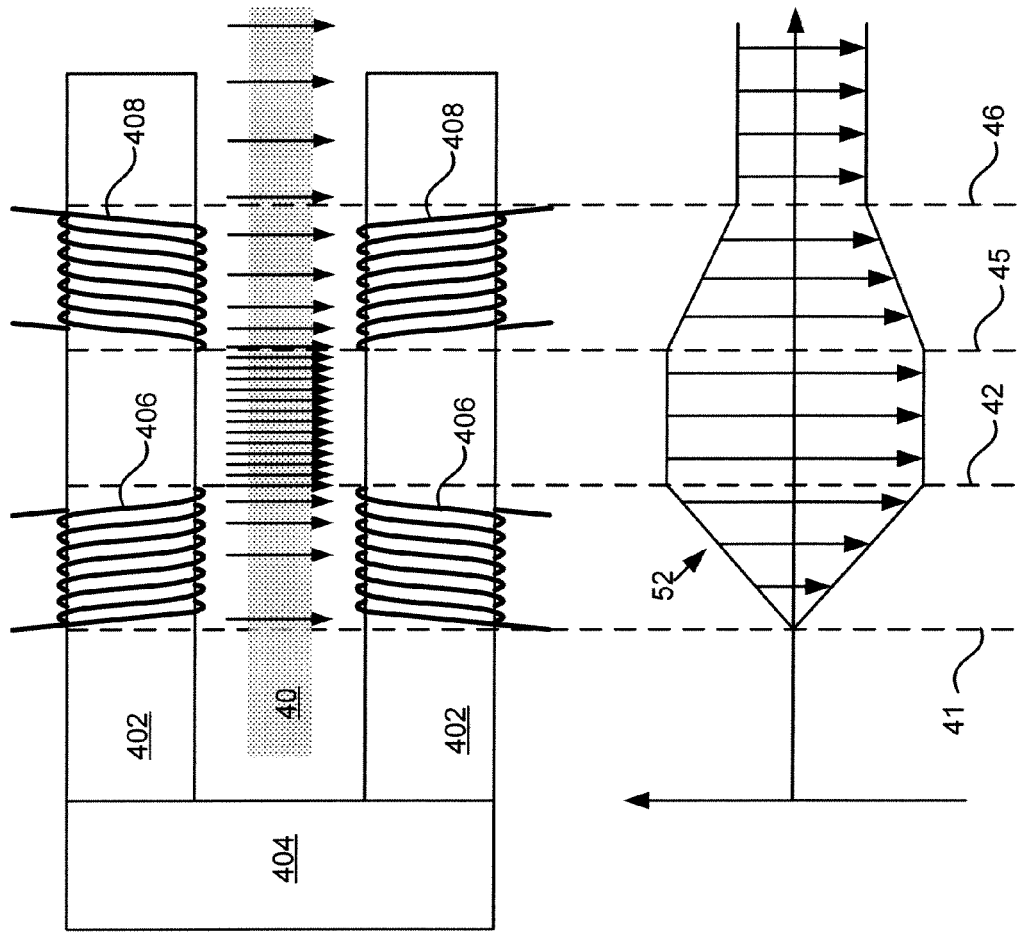
FIG. 5 illustrates another exemplary method for configuring a magnetic field in accordance with an embodiment of the present disclosure.

FIG. 5 illustrates another exemplary method for configuring a magnetic field in accordance with an embodiment of the present disclosure. Based on the same structure as shown in FIG. 4, an additional pair of coils 408 may be added and excited to introduce a section of negative gradient in the magentostatic potential. The individually driven coils 406 and 408 may together create a magnetostatic potential profile 52 which may be a linear combination of the magnetostatic potential profile 44 (shown in FIG. 4) and a new magnetostatic potential profile (not shown) caused by the coils 408. The magnetostatic potential profile 52 shows that the magnetic fields in two regions (i.e., between vertical lines 41 and 42 and between vertical lines 45 and 46) may cause non-uniform or divergent deflections of beamlets in the ribbon beam 40. The magnetic fields in the other two regions (i.e., between vertical lines 42 and 45 and to the right of vertical line 46) may cause uniform deflections of beamlets in the ribbon beam 40.

From the two examples shown in FIGS. 4 and 5, it may be appreciated that a series of field gradient changes may be introduced in a corrector-bar assembly to selectively deflect beamlets or ions within a ribbon beam. The gradient changes may connect smoothly with one another due to the magnetic core members connecting adjacent coils. In addition, the effect from individual coils or pairs of coils may be aggregated.

Figure 6:
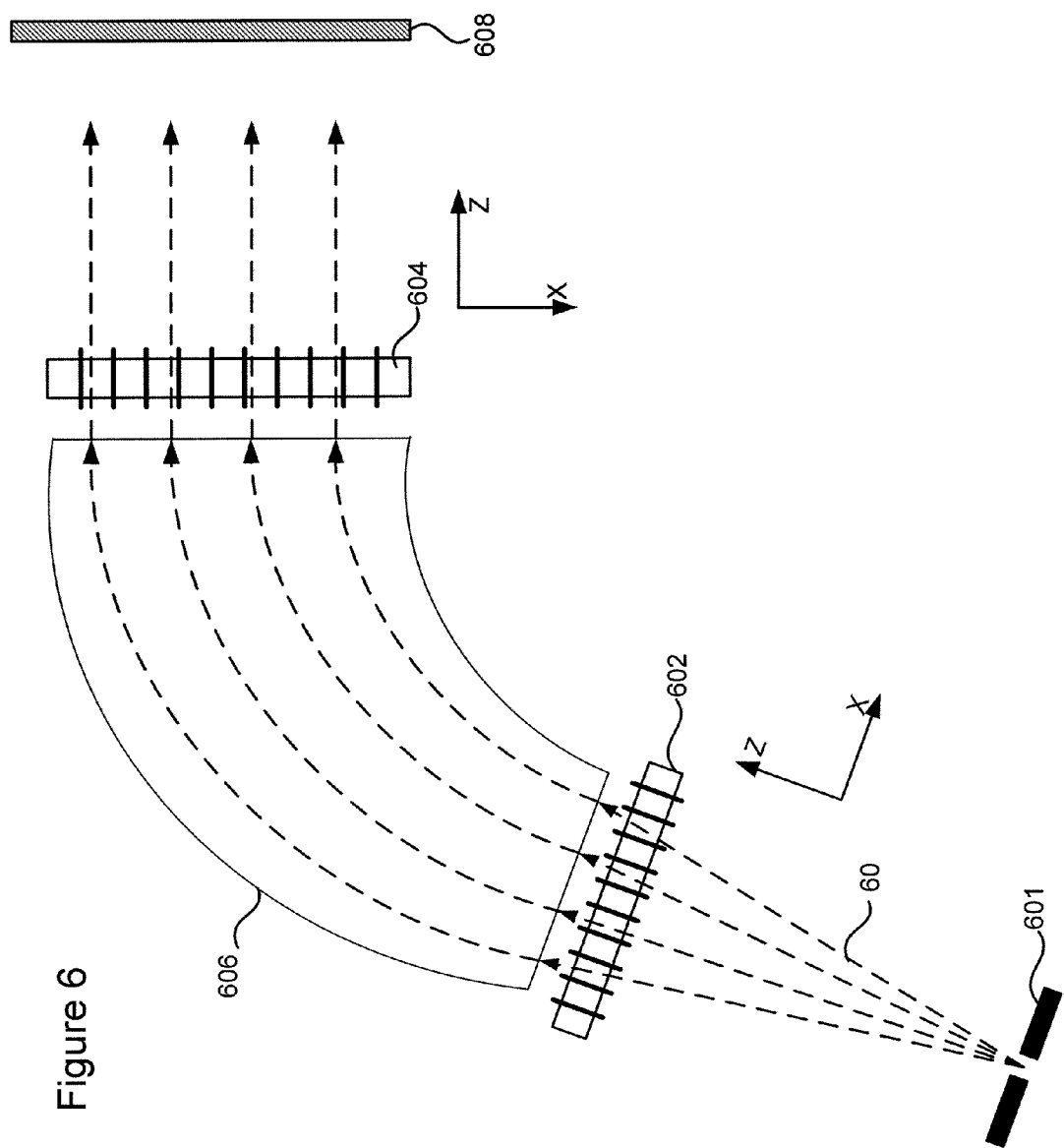
FIG. 6 shows a diagram illustrating an exemplary setup for improving uniformity of a ribbon beam in accordance with an embodiment of the present disclosure.

FIG. 6 shows a diagram illustrating an exemplary setup for improving uniformity of a ribbon beam in accordance with an embodiment of the present disclosure. In an ion implanter, a first corrector-bar assembly 602 (i.e., dose uniformity corrector) may be positioned at or near an entrance of a 70° collimator 606, while a second corrector-bar assembly 604 (i.e., angle uniformity corrector) may be positioned at or near an exit of the 70° collimator 606. An ion beam 60 exiting a mass selection slit 601 may first pass through the first corrector-bar assembly 602, where lateral deflections (in the X direction) may be introduced, for example, to expand the beam width and/or to correct dose uniformity. After the ion beam 60 passes through the 70° collimator 606, angle errors within the ion beam 60 may be corrected by the second corrector-bar assembly 604 to improve angle uniformity. Then, the ion beam 60, with improved dose uniformity and angle uniformity, may be directed at a target wafer 608. Although the corrector-bar assemblies (602 and 604) here are not in parallel with each other, they still facilitate the "two-stage" correction as described above.

According to embodiments of the present disclosure, a dithering motion may be introduced to a ribbon beam to further smooth out small-scale non-uniformity in the ribbon beam. For example, in a two-stage correction setup, a high-frequency current component may be superimposed on excitation currents of individual coils in the second corrector-bar assembly (i.e., angle uniformity corrector). The high-frequency current component may cause an entire ribbon beam (or portions thereof) to be displaced across a target wafer in a reciprocating manner. If the target wafer is exposed to a sufficient number of such displacement reversals, local or small-scale dose and/or angle variations on the target wafer may be averaged out. Since the inductance of each individual coil in the angle uniformity corrector is low, moderately high frequencies may be easy to achieve. The dithering motion may be computer-controlled, and the high-frequency current component may become another process knob for improving beam uniformity.

Figure 7:
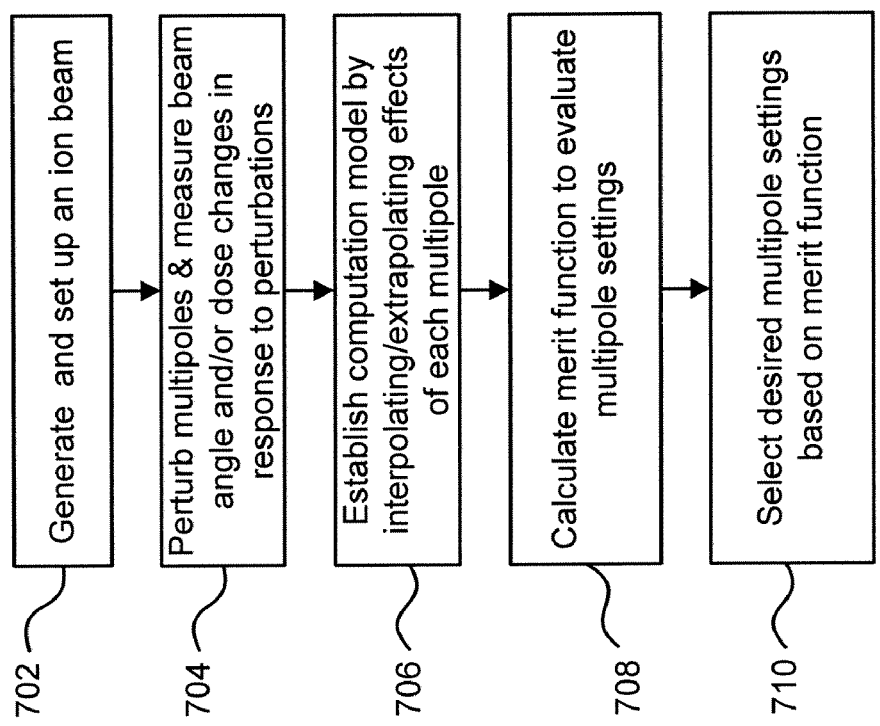
FIG. 7 shows a flowchart illustrating an exemplary method for improving uniformity of a ribbon beam in accordance with an embodiment of the present disclosure.

FIG. 7 shows a flowchart illustrating an exemplary method for improving uniformity of a ribbon beam in accordance with an embodiment of the present disclosure.

In step 702, an ion beam may be generated and set up in an ion implanter. The ion beam may be a ribbon beam and may pass through two stages of corrector-bar assemblies each having individual deflection coils (i.e., multipoles).

In step 704, the multipoles may be perturbed and changes in the angle and/or dose of the ion beam in response to the perturbations may be measured and recorded. For example, a small-scale perturbation may be introduced in an excitation current of a deflection coil, and such a perturbation may cause a corresponding small change (e.g., angle or dose variation) in the ion beam. The perturbation may be repeated, with the same or different magnitudes, on different deflection coils, either one at a time or in combinations. As a result, data reflecting the effect of individual coils (multipoles) on the ion beam may be accumulated. According to embodiments of the present disclosure, the effect in response to the perturbations may be either looked up from a statistical database or calculated by theoretical simulation based on physical models. In step 706, a computation model may be established by aggregating the effect of the individual coils. The data associated with the effect of the individual coils may be interpolated or extrapolated.

In step 708, one or more merit functions may be calculated, based on the computation model, for potential multipole settings. The merit functions may serve to quantify the effect of potential multipole settings on the ion beam angle and/or dose distributions. According to some embodiments, one or more of the following exemplary merit functions may be employed. One exemplary merit function may be defined as:

$$\text{MeritFunctionI} = w \times \text{AngleSpread} + (1-w) \times \text{ProfileSigma}$$

wherein AngleSpread denotes a range of beam angles in the ion beam, ProfileSigma denotes a standard deviation in beam current (or dose) distribution, and w is a configurable weighting factor that defines relative weights of angle uniformity and dose uniformity. Another merit function may be defined as:

$$MeritFunction2 = w \times \frac{AngleSpread}{TargetAngleSpread} + (1-w) \times \frac{ProfileSigma}{TargetProfileSigma}$$

wherein the AngleSpread and ProfileSigma parameters are normalized to their respective target values, such that the relative importance of angle uniformity versus dose uniformity is scaled to desired parameters that may be recipe configurable. A third alternative merit function may be defined as:

$$MeritFunction3 = w \times \frac{AngleSpread}{StartAngleSpread} + (1-w) \times \frac{ProfileSigma}{StartProfileSigma}$$

wherein the AngleSpread and ProfileSigma parameters are normalized to their respective starting values obtained for a base beam profile, such that the relative importance of angle uniformity versus dose uniformity is scaled through iterations.

In step 710, desired multipole settings may be selected based on the one or more merit functions calculated in step 708.

It should be noted that the method described above in connection with FIG. 7 is not limited to the use of corrector-bar technique but may be implemented with any beam tuning element where individual perturbations of an ion beam may be aggregated to establish a computation model that is useful for selecting desired settings for the beam tuning element.

At this point it should be noted that the technique for improving uniformity of a ribbon beam in accordance with the present disclosure as described above typically involves the processing of input data and the generation of output data to some extent. This input data processing and output data generation may be implemented in hardware or software. For example, specific electronic components may be employed in an ion implanter or similar or related circuitry for implementing the functions associated with ribbon beam uniformity control in accordance with the present disclosure as described above. Alternatively, one or more processors operating in accordance with stored instructions may implement the functions associated with ribbon beam uniformity control in accordance with the present disclosure as described above. If such is the case, it is within the scope of the present disclosure that such instructions may be stored on one or more processor readable carriers (e.g., a magnetic disk), or transmitted to one or more processors via one or more signals.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. An apparatus for improving uniformity of a ribbon beam having a plurality of beamlets, the apparatus comprising:
a first corrector-bar assembly having a first set of magnetic core members and a first plurality of coils distributed along the first set of magnetic core members; and
a second corrector-bar assembly having a second set of magnetic core members and a second plurality of coils distributed along the second set of magnetic core members,
wherein the second corrector-bar assembly is located at a predetermined distance from the first corrector-bar assembly;
wherein each of the first plurality of coils is individually excited to deflect at least one beamlet in the ribbon beam, thereby causing the plurality of beamlets to arrive at the second corrector-bar assembly in a desired spatial spread, and
wherein each of the second plurality of coils is individually excited to further deflect one or more beamlets in the ribbon beam, thereby causing the plurality of beamlets to exit the second corrector-bar assembly at desired angles.

2. The apparatus according to claim 1, wherein the desired spatial spread of the plurality of beamlets at the second corrector-bar assembly is achieved to produce a uniform ion dose associated with the ribbon beam exiting the second corrector-bar assembly.

3. The apparatus according to claim 1, wherein the desired angles of the plurality of beamlets are achieved for an angle uniformity associated with the ribbon beam exiting the second corrector-bar assembly.

4. The apparatus according to claim 1, wherein the desired spatial spread of the plurality of beamlets at the second corrector-bar assembly is achieved to produce a non-uniform ion dose associated with the ribbon beam exiting the second corrector-bar assembly.

5. The apparatus according to claim 1, wherein the desired angles of the plurality of beamlets are achieved to produce a spatially varying angle distribution associated with the ribbon beam exiting the second corrector-bar assembly.

6. The apparatus according to claim 1, wherein the deflections introduced by each of the first corrector-bar assembly and the second corrector-bar assembly are linear.

7. The apparatus according to claim 1, further comprising:
a controller that controls the individual excitations of the first plurality of coils and the second plurality of coils.

8. The apparatus according to claim 7, further comprising:
one or more measurement devices that measure the ribbon beam.

9. The apparatus according to claim 8, wherein the controller calibrates the first corrector-bar assembly and the second corrector-bar assembly by separately perturbing one or more of the first plurality of coils and the second plurality of coils and by aggregating corresponding changes in the ribbon beam.

10. The apparatus according to claim 7, wherein the controller causes at least one coil to be excited at a sufficiently high frequency to produce a dithering motion in at least one of the plurality of beamlets.

11. A method for improving uniformity of a ribbon beam, the method comprising the steps of:
providing a first corrector-bar assembly having a first set of magnetic core members and a first plurality of coils distributed along the first set of magnetic core members;
providing a second corrector-bar assembly having a second set of magnetic core members and a second plurality of coils distributed along the second set of magnetic core members, wherein the second corrector-bar assembly is located at a predetermined distance from the first corrector-bar assembly;

passing the ribbon beam through the first corrector-bar assembly;

exciting one or more of the first plurality of coils individually to deflect at least one beamlet in the ribbon beam, thereby causing the plurality of beamlets to arrive at the second corrector-bar assembly in a desired spatial spread; and exciting one or more of the second plurality of coils individually to further deflect one or more beamlets in the ribbon beam, thereby causing the plurality of beamlets to exit the second corrector-bar assembly at desired angles.

12. The method according to claim 11, further comprising: exciting at least one coil with a sufficiently high frequency to produce a dithering motion in at least one beamlet.

13. The method according to claim 11, wherein a current frequency in at least one of the first plurality of coils and the second plurality of coils is adjusted to control a local beamlet angle distribution.

14. The method according to claim 11, further comprising: introducing a plurality of perturbations in one or more coils;

measuring changes in the ribbon beam in response to the plurality of perturbations, each change corresponding to one perturbation;

establishing a computation model by aggregating the measured changes; and selecting settings for the first plurality of coils and the second plurality of coils by evaluating one or more merit functions calculated based on the computation model.

15. At least one signal embodied in at least one carrier wave for transmitting a computer program of instructions configured to be readable by at least one processor for instructing the at least one processor to execute a computer process for performing the method as recited in claim 11.

16. At least one processor readable carrier for storing a computer program of instructions configured to be readable by at least one processor for instructing the at least one processor to execute a computer process for performing the method as recited in claim 11.

17. A method for improving uniformity of a ribbon beam, the method comprising the steps of:

providing one or more tuning elements near a path of a ribbon beam;

introducing a plurality of perturbations in the one or more tuning elements;

measuring changes in the ribbon beam in response to the plurality of perturbations, each change corresponding to one perturbation;

establishing a computation model by aggregating the measured changes; and selecting settings for the one or more tuning elements by evaluating one or more merit functions calculated based on the computation model.

18. The method according to claim 17, wherein the settings for the one or more tuning elements are selected to produce a desired ion dose or angle distribution.

19. The method according to claim 18, wherein the desired ion dose or angle distribution is selected from a group consisting of: a uniform distribution pattern, a non-uniform distribution pattern, and a configurable distribution pattern.

20. The method according to claim 17, wherein the one or more tuning elements are selected from a group consisting of: corrector-bar assemblies, multipoles, dipoles, coils, and magnetic rods.

* * * * *